United States Patent
Min et al.

(10) Patent No.: US 6,669,990 B2
(45) Date of Patent: Dec. 30, 2003

(54) ATOMIC LAYER DEPOSITION METHOD USING A NOVEL GROUP IV METAL PRECURSOR

(75) Inventors: Yo Sep Min, Seoul (KR); Dae Sig Kim, Kyungki-Do (KR); Young Jin Cho, Incheon-Shi (KR); Jung Hyun Lee, Kyungki-Do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 159 days.

(21) Appl. No.: 09/985,690

(22) Filed: Nov. 5, 2001

(65) Prior Publication Data

US 2003/0012876 A1 Jan. 16, 2003

Related U.S. Application Data

(63) Continuation-in-part of application No. 09/933,736, filed on Aug. 22, 2001.

(30) Foreign Application Priority Data

Jun. 25, 2001 (KR) .......................................... 2001-36193

(51) Int. Cl.[7] .............................................. C23C 16/40
(52) U.S. Cl. ........................... 427/255.31; 427/255.32; 427/255.35; 427/255.36; 427/255.37; 47/88; 47/104
(58) Field of Search ............... 117/88, 104; 427/255.31, 427/255.32, 255.35, 255.36, 255.37

(56) References Cited

PUBLICATIONS

Doherty et al., Organometallics vol. 18, No. 6, 1999, pp. 1018–1029.*

* cited by examiner

*Primary Examiner*—Timothy Meeks
(74) *Attorney, Agent, or Firm*—Birch, Stewart, Kolasch & Birch, LLP

(57) ABSTRACT

An atomic layer deposition method which comprises forming a metal oxide thin film by using, as a group IV metal precursor, a complex of a formula $M(L)_2$ in which M is a group IV metal ion having a charge of +4 and L is a tridentate ligand having a charge of −2, the ligand being represented by the following formula (I):

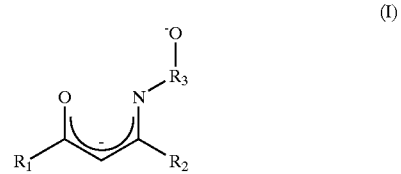

(I)

wherein each of $R_1$ and $R_2$, independently, is a linear or branched $C_{1-4}$ alkyl group; and $R_3$ is a linear or branched $C_{1-5}$ alkylene group. The group IV metal precursor exhibits excellent thermal and chemical stabilities under a carrier gas atmosphere, whereas it has high reactivity with a reaction gas.

4 Claims, 8 Drawing Sheets

ATOMIC LAYER DEPOSITION METHOD USING A NOVEL GROUP IV METAL PRECURSOR

The present application is a continuation-in-part of application Ser. No. 09/933,736, filed on Aug. 22, 2001, the subject matter thereof being incorporated herein by reference.

Priority Korean Patent Application 2001-36193 filed Jul. 25, 2001, is incorporated herein in its entirety by reference.

BACKGROUND OF THE INVENTION

1. Field of the Invention

The present invention relates to an atomic layer deposition method using a novel group IV metal precursor. More particularly, the present invention relates to an efficient atomic layer deposition method which comprises forming a metal oxide thin film on a substrate by using a group IV metal precursor which is thermally and chemically stable in a carrier gas and highly reactive with a reaction gas.

2. Description of the Prior Art

Recently, there have been performed many studies on the application of an atomic layer deposition method to the formation of a high-k gate oxide film or a dielectric thin film for a capacitor, because the atomic layer deposition method is generally advantageous over a chemical vapor deposition method with respect to the insurance of a uniform composition and thickness of the thin films so deposited.

Metal precursors to be used in the atomic layer deposition method should meet the following qualifications. First, the precursors should be highly volatile as well as thermally and chemically stable in a carrier gas such as $N_2$ or Ar so that they can be efficiently and steadily delivered from a vaporizer to a deposition chamber. Secondly, the precursors should be highly reactive with a reaction gas such as $O_2$ and the like so that the dissociation of ligands from a central metal ion can occur rapidly and completely upon effecting the reaction. Thirdly, the bulkiness or the molecular weight of the precursors should be small so that the deposition rate can be increased, which is defined as the film thickness per one deposition cycle composed of chemical absorption-purge-reaction-purge. Currently, the deposition rate is regarded as a critical defect of the conventional atomic layer deposition method.

The conventional precursors which have been used in the atomic layer deposition method include metal alkoxides such as titanium tetrakis(iso-propoxide), Ti(O-iPr)4; Cp compounds such as cyclopentadienyl titanium; and metal halides such as $TiCl_4$. These prior precursors have small bulkiness due to their low molecular weight and have high reactivity with a reaction gas such as $O_2$. However, the prior precursors are problematic because of their instability in that they are inferior in thermal and chemical stabilities under a carrier gas atmosphere. In particular, the metal halide-based precursors are unsuitable for a semiconductor process. In order to solve these problems, metal β-diketonate-based precursors such as $Ti(thd)_2(O-iPr)_2$ (titanium bis(iso-propoxide) bis(2,2,6,6,-tetramethyl-3,5-heptanedionate)) have been developed as an alternative precursor. These metal β-diketonate-based precursors, however, are not desirable in that dissociation of the β-diketonate ligands from the metal ion is difficult because of their low reactivity with a reaction gas, and also the deposition rate is low because of their high molecular weight. Under these circumstances, there has been a continuous need for a precursor appropriate for atomic layer deposition, which is thermally and chemically stable under a carrier gas atmosphere and highly reactive with a reaction gas.

SUMMARY OF THE INVENTION

A feature of the present invention is an atomic layer deposition method using a novel group IV metal precursor made by coordinating, as a ligand, N-alkoxy-β-ketoiminates with a group IV metal ion, the precursor being thermally and chemically stable in a carrier gas and easy to disassociate the ligands from the metal ion due to its high reactivity with a reaction gas.

In accordance with one aspect of the present invention, there is provided an atomic layer deposition method which comprises forming a metal oxide thin film by using, as a group IV metal precursor, a complex of the formula $M(L)_2$, in which M is a group IV metal ion having a charge of +4 and L is a tridentate ligand having a charge of −2, the ligand being represented by the following formula (I):

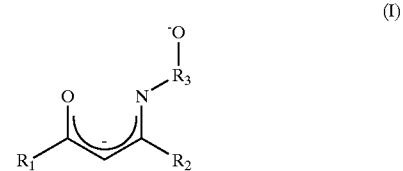

(I)

wherein each of $R_1$ and $R_2$, independently, is a linear or branched $C_{1-4}$ alkyl group; and $R_3$ is a linear or branched $C_{1-5}$ alkylene group.

BRIEF DESCRIPTION OF THE DRAWINGS

The above and other objects and aspects of the present invention will be apparent from the following description of embodiments with reference to the accompanying drawings, in which.

DETAILED DESCRIPTION OF THE PREFERRED EMBODIMENTS

Figure 1A:
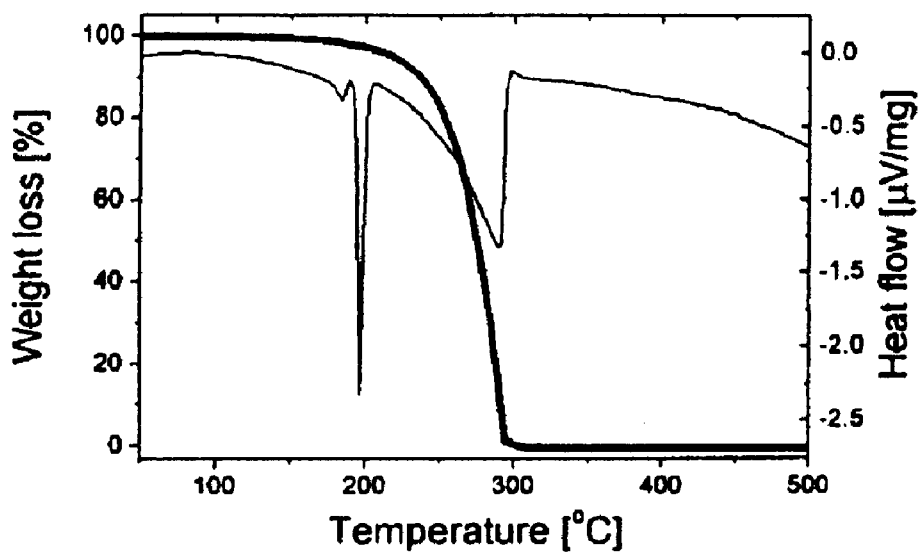
FIG. 1a is a plot of TG-DSC curves according to a temperature rise under a nitrogen atmosphere (20 ml/min) for the precursor titanium bis [4-(2-methylethoxy)imino-2-pentanoate] (Ti (2 meip)$_2$) of the present invention.

The present invention provides an atomic layer deposition method using, as a titanium precursor, titanium (N-alkoxy-β-ketoiminate)₂ which was previously reported as a catalyst in "Organometallics, 18, 1018 (1999)". Such a titanium precursor is saturated at vacant coordination sites of the central titanium ion with two tridentate ligands which show much enhanced chelate effect over a bidentate ligand. Therefore, this precursor is excellent in chemical stability and thermal properties, and does not leave residue after vaporization. Also, this precursor can be controlled with respect to its thermal properties, such as vaporization temperature, and residue amount after vaporization, etc. This allows the insurance of a similarity in volatility and decomposition behaviors among metal precursors that are used in the deposition of a multi-component metal oxide thin film containing titanium. The ligand N-alkoxy-β-ketoiminate can be also applied to other group IV metal ions including Si, Zr, Hf, Ge, Sn and Pb in addition to Ti.

Briefly, the method of the present invention utilizes, as a group IV metal precursor, a complex represented by a formula M(L)₂ where M is a group IV metal ion and L is a ligand. The ligand (L) is characterized in that it is N-alkoxy-β-ketoiminate having a charge of −2 as indicated in the formula (I) below and is coordinated to a group IV metal ion having a charge of +4 as a tridentate ligand:

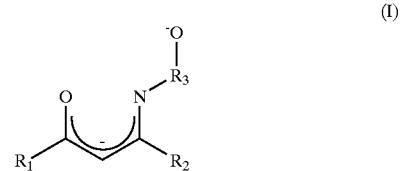

wherein each of $R_1$ and $R_2$, independently, is a linear or branched $C_{1-4}$ alkyl group; and $R_3$ is a linear or branched $C_{1-5}$ alkylene group. In particular, the $R_1$ and $R_2$ groups may be the same or different from one another to render the ligand (L) asymmetric.

To further improve the chelate effect of the ligand, the present invention introduces a linear or branched N-alkoxy group having a charge of −1 to a nitrogen atom of β-ketoiminate to convert the β-ketoiminate into a tridentate ligand having a charge of −2. The tridentate ligand thus prepared is strongly bound to a metal ion while saturating vacant coordination sites of the metal ion. Accordingly, the metal complex with the ligand (L) obtains excellent chemical and thermal stabilities.

On the other hand, a M—N bond between the nitrogen atom (N) of the tridentate ligand and the metal ion (M) is relatively weak as compared with a M—O bond between the oxygen atom (O) of the prior β-diketonate ligand and the metal ion (M), so that it can be easily oxidized by O₂ gas, and thereby the tridentate ligand can effortlessly dissociate from the metal ion. This renders the oxidization process of the atomic layer deposition method of the present invention to be easily accomplished. Moreover, use of the precursors of the present invention enables an increase of the deposition rate because their molecular weight is relatively low.

Meanwhile, precursors of a formula M(OR)ₙ and precursors of a formula M(OR)ₓ(β-diketonate)y are generally converted into metal hydroxide complexes when being left to stand in air. In contrast, the precursors with the tridentate ligand according to the present invention, in particular the precursor Ti(2 meip)₂ (titanium bis(4-(2-methylethoxy) imino-2-pentanoate) according to the following Example 2, have an excellent hydrolytic stability, as well as an excellent chemical stability in that they are not structurally changed even when being left to stand in air for three months or more.

The precursors according to the present invention exhibit highly improved thermal stability, moisture proof and hydrolytic stability. These properties are significantly dependent on the asymmetry of the ligand as well as the kind of the groups $R_1$, $R_2$ and $R_3$.

The following examples are for further illustration purposes only and in no way limit the scope of this invention.

EXAMPLE 1

Preparation of CH₃C(O)CHC(HNCH₂CH(CH₃)OH) CH₃

As described in Organometallics, 18, 1018 (1999), 22.51 g (299.7 mmol) of 1-amino-2-propanol of a formula NH₂CH₂CH(CH₃)OH and 20 g (199.8 mmol) of 2,4-pentanedione, as starting materials, were mixed with 120 ml of CH₂Cl₂, and stirred for one day at room temperature. Then, the resulting material was extracted with a mixed solution of H₂O/CH₂Cl₂ (15 ml/150 ml) into an organic layer, and the remaining water layer was further extracted three times with 100 ml of a CH₂Cl₂ solution. After drying the collected organic solution in the presence of MgSO₄, the solvent was removed from the solution, and CH₂Cl₂/n- hexane (10 ml/140 ml) was added thereto. As a result, the mixture was recrystallized at −20° C. to give 29.83 g (95% yield) of $CH_3C(O)CHC(HNCH_2CH(CH_3)OH)CH_3$.

EXAMPLE 2

Preparation of $Ti(CH_3C(O)CHC(NCH_2CHCH_3O)CH_3)_2$, $Ti(2\ meip)_2$ 11.06 g (70.36 mmol) of the tridentate ligand $CH_3C(O)CHC(CH_3)$ $(HNCH_2CH(CH_3)OH)$ prepared in Example 1 was dissolved in 20 ml of methylene dichloride. To this solution, a solution of 10.00 g (35.18 mmol) of titanium (iso-propoxide)4, $Ti(O-iPr)_4$, in 25 ml of methylene dichloride was added through a cannula at room temperature with stirring. The mixed yellowish solution was stirred for 4 hours or more, and then the solvent was removed therefrom under a reduced pressure. The remaining material was recrystallized from a mixed solution of methylene dichloride and n-hexane at −20° C. to give 12.18 g (96% yield) of $Ti(CH_3C(O)CHC(NCH_2CHCH_3O)CH_3)_2$ as a pure yellow solid.

EXAMPLE 3

Volatility of $Ti(2\ meip)_2$

Figure 1B:
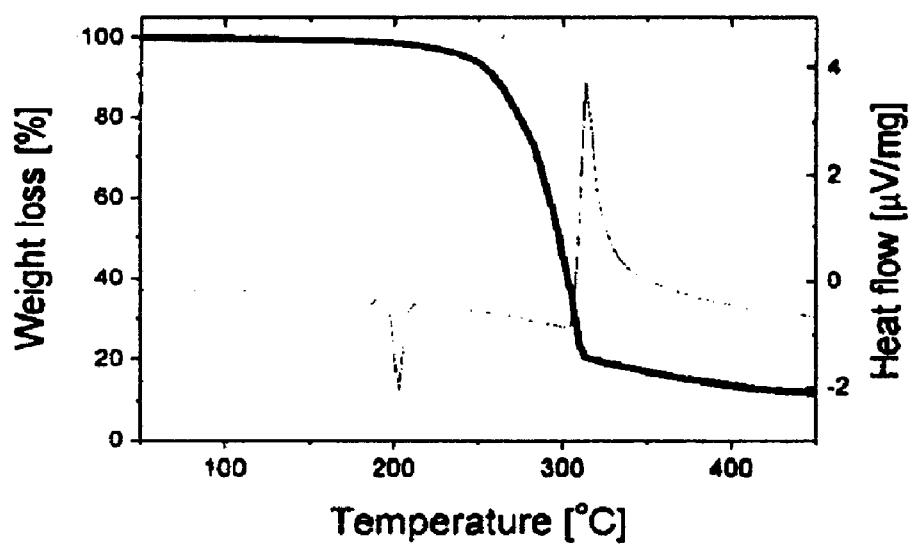
FIG. 1b is a plot of TG-DSC curves according to a temperature rise under an oxygen atmosphere (30 ml/min) for the precursor Ti(2 meip)$_2$ of the present invention.
Figure 2:
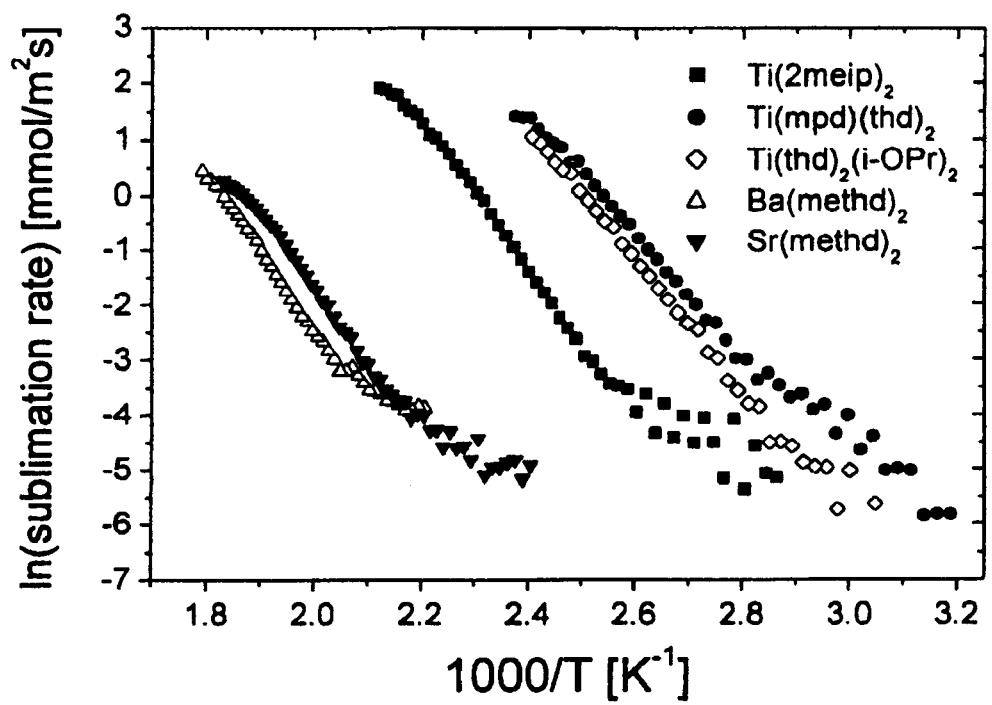
FIG. 2 is a plot of graphs showing vaporization rates according to temperature which are measured in thermo gravimetric analysis for the precursor Ti(2 meip)$_2$ of the present invention and the commercially available precursors including titanium (2-methyl-2,4-dioxy-pentane) bis(2,2,6,6-tetramethyl-3,5-heptanedionate) (Ti(mpd) (thd)$_2$), titanium bis(iso-propoxide) bis(2,2,6,6-tetramethyl-3,5-heptanedionate) (Ti(thd)$_2$(O-iPr)$_2$), titanium tetrakis(iso-propoxide) (Ti(OiPr)$_4$), barium bis(1-methoxyethoxy-2,2,6,6,-tetramethyl-3,5-hetanedionate) (Ba(methd)$_2$), and strontium bis(1-methoxyethoxy-2,2,6,6,-tetramethyl-3,5-hetanedionate) (Sr(methd) 2)

The precursor $Ti(2\ meip)_2$ prepared in Example 2 was analyzed by TG-DSC under nitrogen atmosphere and oxygen atmosphere. The results are shown in FIGS. 1a and 1b. As seen from FIG. 1a, the precursor $Ti(2\ meip)_2$ was rapidly vaporized in a temperature range of 250 to 300° C. and leaved few residues less than 0.5% after vaporized. Thus, $Ti(2\ meip)_2$ was proved to have excellent volatility. Further, it could be found that the precursor $Ti(2\ meip)_2$ was not decomposed during the vaporization, because no exothermal peaks were observed before and after the vaporization. While the precursor $Ti(2\ meip)_2$ has a relatively low vaporization rate compared to the prior titanium precursors as shown in FIG. 2, it exhibits more high volatility than the conventional alkali earth metal precursors. Thus, the precursor $Ti(2\ meip)_2$ is useful particularly in formation of a multi-component thin film with the alkali earth metal precursors.

EXAMPLE 4

Figure 3A:
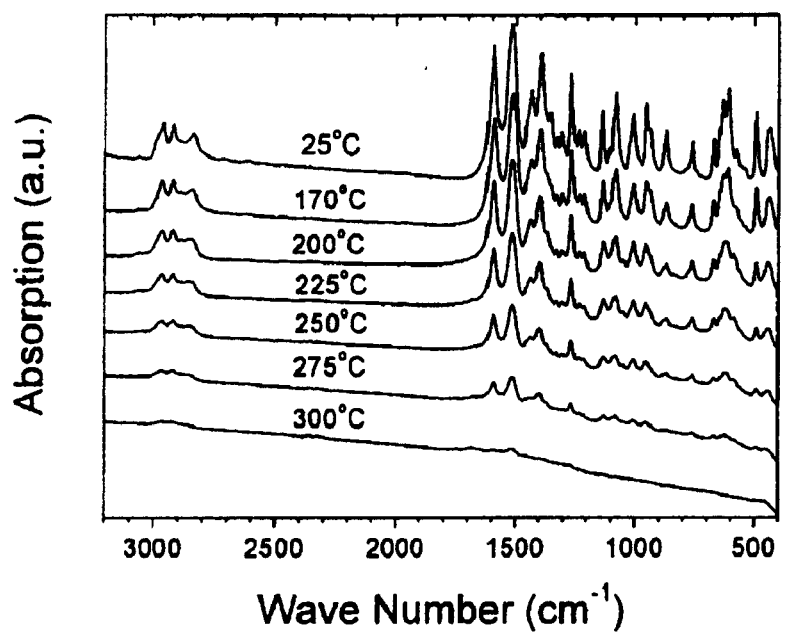
FIG. 3a is a plot of IR spectrums according to a temperature rise under vacuum condition (about 1 torr) for the precursor Ti(2 meip)$_2$ of the present invention.
Figure 3B:
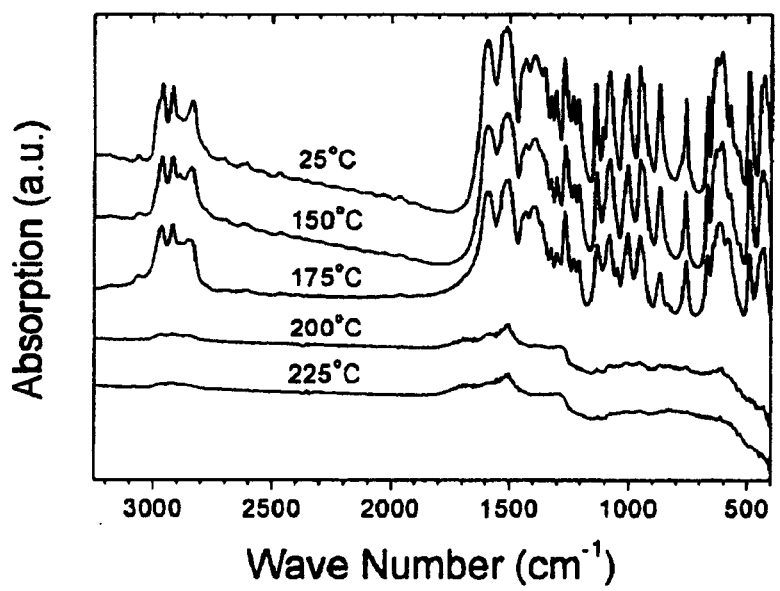
FIG. 3b is a plot of IR spectrums according to a temperature rise under an oxygen atmosphere (200 ml/min, atmospheric pressure) for the precursor Ti(2 meip)$_2$ of the present invention.
Figure 4:
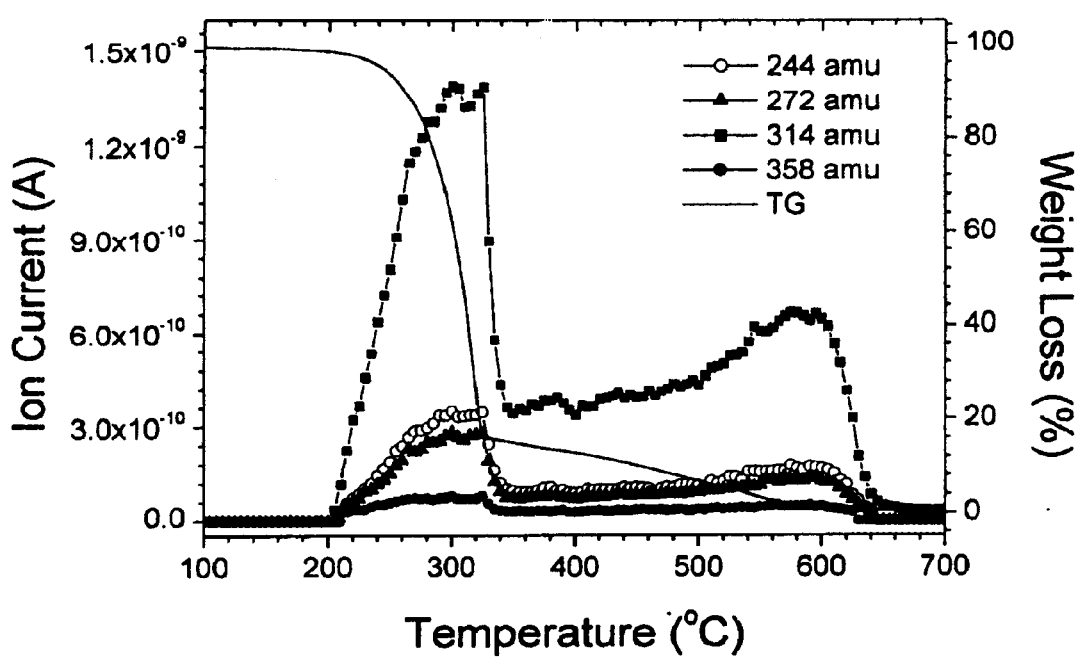
FIG. 4 is a plot of TG-MASS spectra according to a temperature rise under a helium atmosphere (70 ml/min) for the precursor Ti(2 meip)$_2$ of the present invention.
Figure 5A:
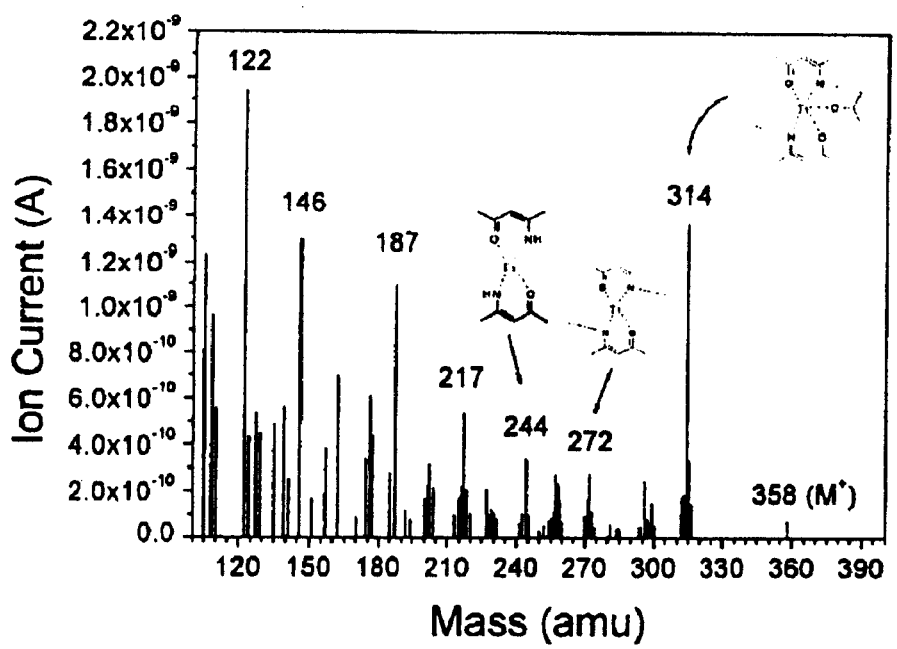
FIG. 5a is a graph showing results of mass spectrometry for a gas evolved from the precursor Ti(2 meip)₂ of the present invention under a helium atmosphere (70 ml/min) at 320° C.
Figure 5B:
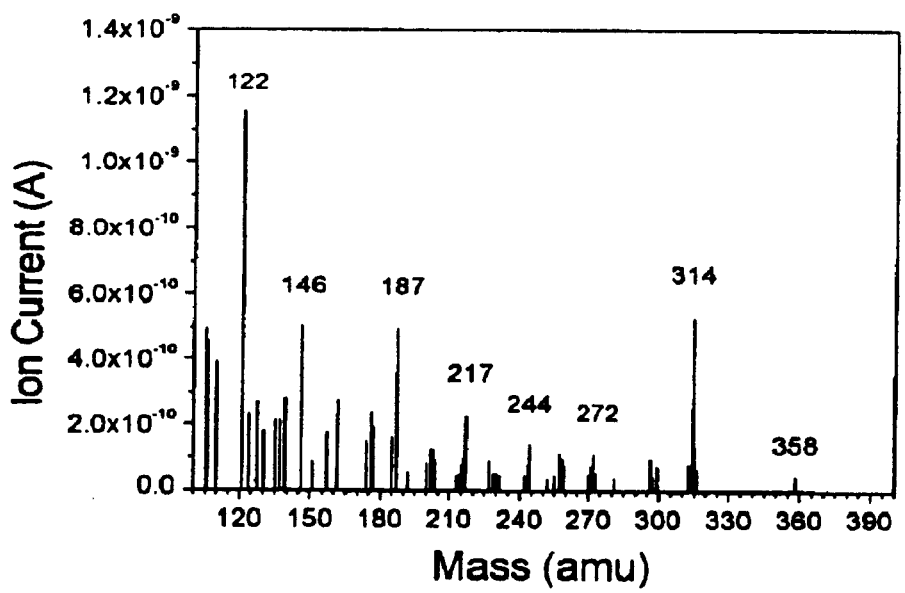
FIG. 5b is a graph showing results of mass spectroscopy for a gas evolved from the precursor Ti(2 meip)₂ of the present invention under a helium atmosphere (70 ml/min) at 530° C.

Chemical and Thermal Stabilities of $Ti(2\ meip)_2$ Under a Carrier Gas Atmosphere IR spectra of the precursor $Ti(2\ meip)_2$ prepared in Example 2 were obtained according to a temperature rise and plotted in FIGS. 3a and 3b. As seen in FIG. 3a, position of the respective absorption peaks did not change along with the temperature rise, whereas intensity of the peaks declined due to reduction of the precursor amount by vaporization. This indicates that the precursor $Ti(2\ meip)_2$ has excellent thermal and chemical stabilities. Moreover, TG-MASS spectrum of $Ti(2\ meiP)_2$ is shown in FIG. 4, from which it could be also found that $Ti(2\ meip)_2$ is thermally stable, because a peak at 358 m/z corresponding to its molecular weight constantly appeared even up to a high temperature. Further, gases evolved from the precursor $Ti(2\ meip)_2$ at 320° C. and 530° C., respectively, were subjected to mass spectrometry, and the results are shown in FIGS. 3a and 5b. The mass spectra at the two temperatures were substantially identical, which indicated that thermal decomposition of the precursor did not occur even at a high temperature.

EXAMPLE 5

Decomposition Property of $Ti(2\ meip)_2$ Under Oxygen Atmosphere

Figure 6A:
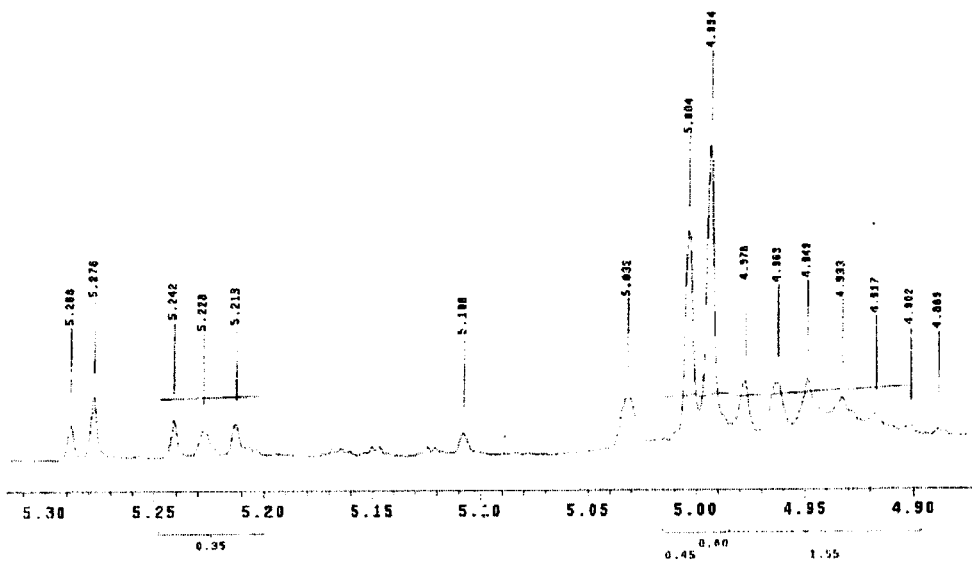
FIG. 6a is a ¹H-NMR spectrum for a liquid obtained by condensing a gas produced from oxidation of the precursor Ti(2 meip)₂ of the present invention under an oxygen atmosphere (70 ml/min) at 230° C.
Figure 6B:
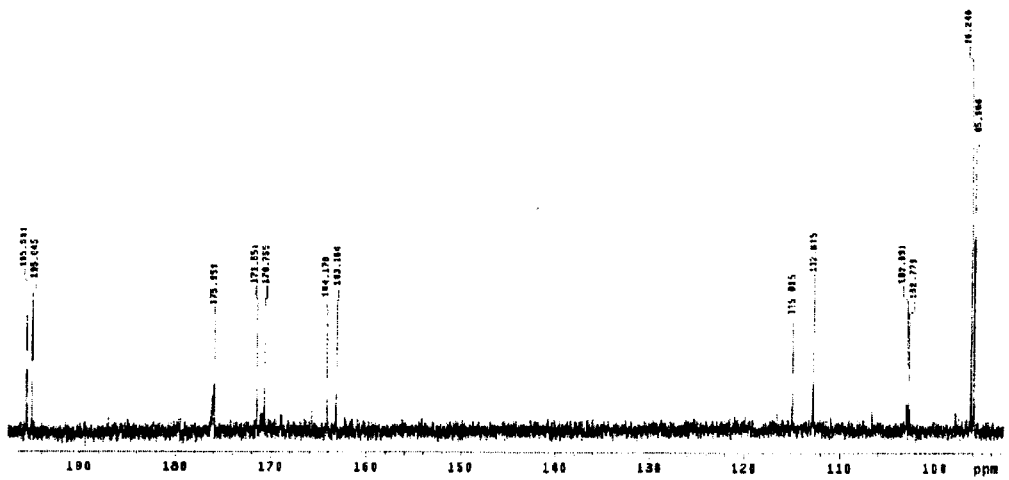
FIG. 6b is a ¹³C-NMR spectrum for a liquid obtained by condensing a gas produced from oxidation of the precursor Ti(2 meip)₂ of the present invention under an oxygen atmosphere (70 ml/min) at 230° C.
Figure 7:
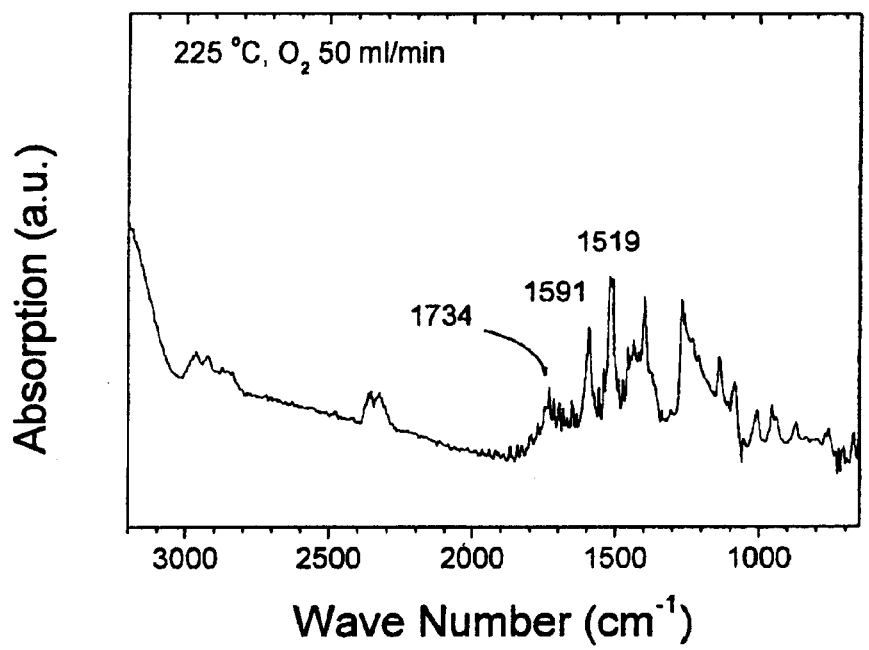
FIG. 7 is a gaseous IR spectrum for a gas produced from oxidation of the precursor Ti(2 meip)₂ of the present invention under an oxygen atmosphere (50 ml/min) at 225° C.

From TG-DSC curves under oxygen atmosphere shown in FIG. 1b, a very strong and sharp exothermic peak could be seen over a temperature range of 200 to 350° C. This is consistent with the fact that, as seen in FIG. 3b, specific IR absorption peaks of the precursor $Ti(2\ meip)_2$ got to disappear with the temperature rising over 200° C., as a result of rapid oxidization and decomposition of the precursor at such a temperature range. Furthermore, a gas produced from oxidization of the precursor $Ti(2\ meip)_2$ under oxygen atmosphere (70 ml/min) at 230° C. was condensed to a liquid, which was then subjected to $^1H$-NMR and $^{13}C$-NMR analyses. In the NMR spectra shown in FIGS. 6a and 6b, typical peaks of ketoimine could be identified. Additionally, gaseous IR spectrum for a gas produced from decomposition of $Ti(2\ meip)_2$ under oxygen atmosphere also exhibited absorption peaks of ketoimine (see, FIG. 7). Thus, it could be found that the precursor $Ti(2\ meip)_2$ was decomposed into a ketoimine under oxygen atmosphere because alkoxides were dissociated from a ligand and Ti—N bond was weak. These decomposition properties explain the reason that $Ti(2\ meip)_2$ was rapidly oxidized and decomposed with showing a steep exothermic peak as seen in FIG. 1b.

EXAMPLE 6

Figure 8:
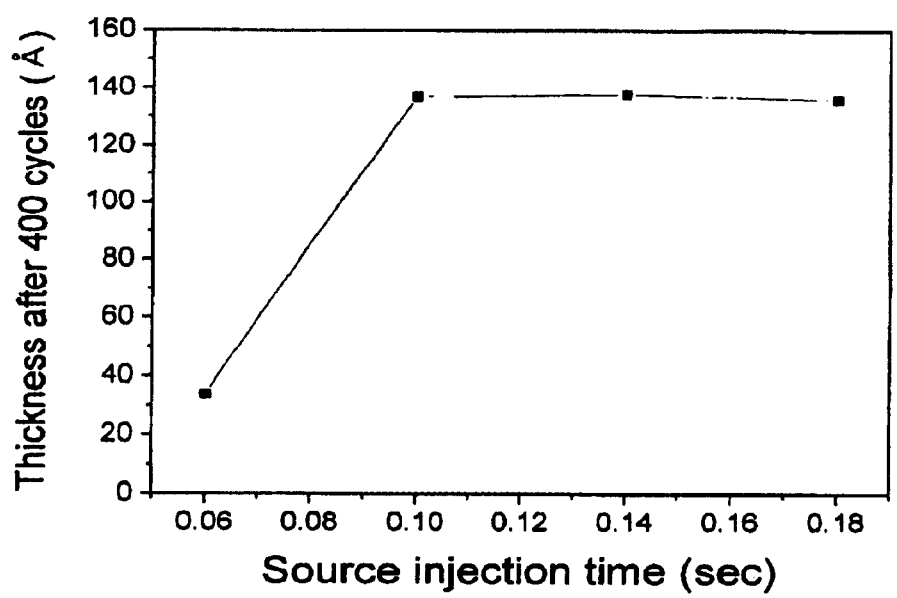
FIG. 8 is a graph showing a variation in thickness of a SrTiO₃ thin film according to source injection time, wherein the SrTiO₃ film was deposited at 280° C. by an atomic layer deposition method using the precursor Ti(2 meip)₂ of the present invention and a commercial precursor Sr(thd)₂ (strontium bis(2,2,6,6-tetramethyl-3,5-heptanedionate) and the deposition was repeated for 400 cycles.
Figure 9:
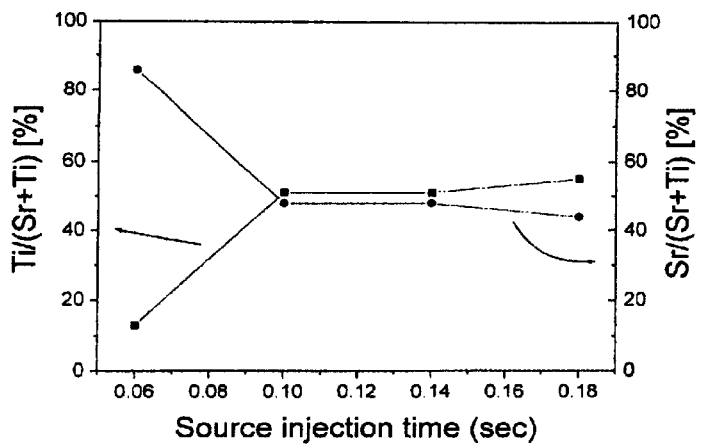
FIG. 9 is a graph showing a variation in titanium and strontium contents in a SrTiO₃ thin film according to source injection time, wherein the SrTiO₃ film was deposited in the same manner as in FIG. 8.
Figure 10:
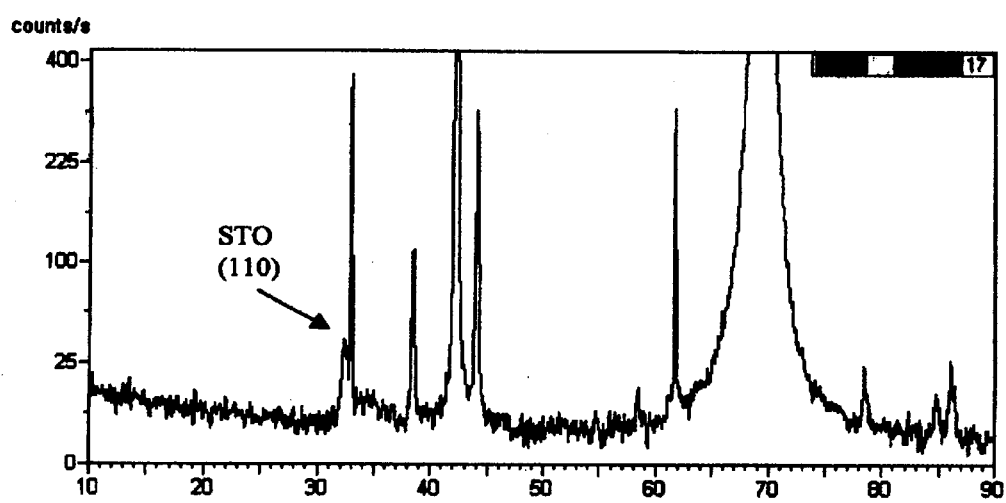
FIG. 10 is a XRD pattern for a SrTiO₃ thin film deposited in the same manner as in FIG. 8.

Formation of a $SrTiO_3$ Thin Film by an Atomic Layer Deposition Method Using $Ti(2\ meip)_2$ Atomic layer deposition of $SrTiO_3$ thin films was carried out in an atomic layer deposition system equipped with a plasma under a reduced pressure of 3 torr at 250° C., by using a THF solution containing 0.2M $Ti(2\ meip)_2$ and 0.2M $Sr(thd)_2$. In the deposition, purge time with Ar gas following adsorption was set to 3 seconds, plasma (180W)-radiation time was set to 2 seconds, and purge time with Ar gas following oxidization was set to 0.8 seconds. Variations in the thickness and the contents of Ti and Sr of the resulting $SrTiO_3$ thin film according to source injection time are shown in FIGS. 8 and 9, respectively. As seen in FIG. 8, saturation of the adsorption of the precursor, which is characteristic of atomic layer deposition, was observed when the precursor was injected into the deposition chamber for 0.1 seconds. Similarly, as seen in FIG. 9, Sr and Ti contents in the $SrTiO_3$ thin film became quantitatively identical with each other from the same moment. From FIG. 10, XRD pattern of the SrTiO3 thin film thus formed, it could be found that STO phase was effectively formed at a relatively low temperature without additional heat treatment following the deposition.

As apparent from the foregoing, the group IV metal precursor according to the present invention is very useful for an atomic layer deposition method in that: firstly, it has high volatility suitable for the formation of a thin film, as well as leaves little or no residues after volatilized; secondly, it has excellent thermal and chemical stabilities under a carrier gas atmosphere such as $N_2$ or Ar; and, thirdly, it has so good thermal properties as to decompose completely under oxygen atmosphere.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An atomic layer deposition method which comprises forming a metal oxide thin film by using, as a group IV metal precursor, a complex of a formula M(L)₂ in which M is a group IV metal ion having a charge of +4 and L is a tridentate ligand having a charge of −2, the ligand being represented by the following formula (I):

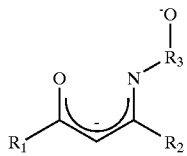

wherein each of $R_1$ and $R_2$, independently, is a linear or branched $C_{1-4}$ alkyl group; and $R_3$ is a linear or branched $C_{1-5}$ alkylene group.

2. The atomic layer deposition method according to claim 1, wherein M is Ti.

3. The atomic layer deposition method according to claim 1, wherein the metal oxide thin film formed therein is a multi-component thin film containing a group IV metal.

4. The atomic layer deposition method according to claim 1, wherein the metal oxide thin film formed therein is a multi-component thin film containing titanium.

* * * * *